United States Patent

Dickmann

[11] Patent Number: 5,753,960
[45] Date of Patent: May 19, 1998

[54] CIRCUIT WITH MONOLITICALLY INTEGRATED P-I-N/SCHOTTKY DIODE ARRANGEMENT

[75] Inventor: Juergen Dickmann, Ulm, Germany

[73] Assignees: Daimler Benz AG; Temic Telefunken microelectronic GmbH

[21] Appl. No.: 699,694

[22] Filed: Aug. 19, 1996

[30] Foreign Application Priority Data

Aug. 19, 1995 [DE] Germany ............ 195 30 525.6

[51] Int. Cl.⁶ ............................................. H01L 31/075
[52] U.S. Cl. ............................................. 257/458; 257/485
[58] Field of Search .................. 257/655, 656, 257/458, 485

[56] References Cited

U.S. PATENT DOCUMENTS

| | | |
|---|---|---|
| 3,586,929 | 6/1971 | Burmeister et al. |
| 4,249,134 | 2/1981 | Stacey ................ 329/205 R |
| 4,640,003 | 2/1987 | Papanicolaou ............ 29/576 B |
| 4,836,650 | 6/1989 | Morin et al. ............ 350/334 |
| 4,982,269 | 1/1991 | Calligaro ............ 257/458 |
| 5,102,822 | 4/1992 | Calligaro ............ 437/67 |
| 5,242,839 | 9/1993 | Oh et al. ............ 257/458 |
| 5,272,370 | 12/1993 | French ............ 257/353 |

FOREIGN PATENT DOCUMENTS

0508128A2  10/1992  European Pat. Off.

*Primary Examiner*—Minh-Loan Tran
*Assistant Examiner*—David B. Hardy
*Attorney, Agent, or Firm*—Spencer & Frank

[57] ABSTRACT

A monolithically integrated circuit for carrying out different mixer and switch functions includes: at least one p-i-n diode and at least one Schottky diode monolithically integrated in the circuit. The p-i-n diode and Schottky diode are made from a common semiconductor layer sequence. The semiconductor layer sequence respectively includes: highly doped p-contact and n-contact layers, and a lightly doped insulating layer grown between the contact layers and which includes an etch arresting layer at a defined distance d from one of the contact layers.

6 Claims, 2 Drawing Sheets

CIRCUIT WITH MONOLITICALLY INTEGRATED P-I-N/SCHOTTKY DIODE ARRANGEMENT

CROSS-REFERENCE TO RELATED APPLICATIONS

This application claims the priority of Patent Application Serial No. 195 30 525 filed in Germany on Aug. 19, 1995, the subject matter of which is incorporated herein by reference.

BACKGROUND OF THE INVENTION

The invention relates to a monolithically integrated circuit which includes at least one p-i-n diode and at least one Schottky diode for carrying out mixer and switch functions.

The invention is used, for example, in integrated millimeter wave circuits for generation and reception of signals in radar systems or communication systems. Such systems have front-ends which comprise, among other things, oscillators, amplifiers, mixers, frequency doublers and switches. Mixer functions can be realized by Schottky diodes and switch functions by p-i-n diodes. It is known to use p-i-n diodes as switches from publications by Charles M. Howell in *Mikrowellen und Optoelektronik* [*Microwaves and Optoelectronics*] (MIOP/89); and A. Klassen and H.-E. Sasse in *Proc. Internat. Workshop of the German IEEE Joint MTT/AP Chapter*: "Silicon Based High Frequency Devices and Circuits", vol. 10–11, 1994, p. 19. Here, Si as well as III/V semiconductor compounds can be used as semiconductor materials. GaAs Schottky diodes have very good mixer properties for room temperature applications for working frequencies far into the submillimeter wavelength range (D. G. Garfield et al.: "RF-Performance of a Novel Planar Millimeter-Wave Diode Incorporating an Etched Surface channel", *IEEE Transaction on Microwave Theory and Techniques* 39(1) 1991, p. 1–5). The use of Schottky diodes as mixers for millimeter wave front-ends, with the millimeter wave circuits being fabricated with the GaAs MESFET technology, is outlined in a publication by B. Adelseck et al. in *Proc. Military Microwave* 1952, p. 209–214. This technology allows the monolithic integration of a Schottky diode and MESFET. It is thus possible to fit different functions on one chip.

SUMMARY OF THE INVENTION

It is an object of the invention to accomplish a high degree of integration of switch and mixer functions required in front-ends on one chip and to thus reduce the fabrication costs.

The above and other objects of the invention are accomplished according to the invention by the provision of a monolithically integrated circuit for carrying out different mixer and switch functions, comprising: at least one p-i-n diode and at least one Schottky diode monolithically integrated in the circuit, wherein the p-i-n diode and Schottky diode are made from a common semiconductor layer sequence, and the semiconductor layer sequence respectively includes: highly doped p-contact and n-contact layers, and a lightly doped insulating layer grown between the contact layers and which includes an etch arresting layer at a defined distance d from one of the contact layers.

The invention offers the advantage that different components such as p-i-n diodes and Schottky diodes are monolithically integrated on a chip and that switch and mixer functions can be realized in this manner. Thus, it is possible, for example, to fabricate the front end of a radar module or communication module in a few production steps. FIG. 1 shows, for example, a schematic circuit configuration of a radar module front end. With the present invention it is possible, for example, to monolithically integrate the switches $S_1$, $S_2$ and the mixer on one chip. The switch circuits may be so-called "single-pole double-throw" (SPDT) circuits for which one or several p-i-n diodes are required. For the mixer, Schottky diodes are used.

Furthermore, it is advantageous for the p-i-n and Schottky diodes to be arranged in mesa construction since the electrical field extending perpendicularly to the semiconductor layers results in faster switching times.

According to a further aspect of the invention there is provided a method of fabricating a monolithically integrated p-i-n/Schottky diode arrangement which includes a p-i-n diode region and a Schottky diode region, each region having electrical contacts, comprising the steps of: epitaxially growing, on a semiconductor substrate, an n-contact layer, an insulating layer which includes an etch arresting layer, and a p-contact layer; removing, with an etching agent, the p-contact layer and the insulating layer in the Schottky diode region so that the etching agent is stopped at the etch arresting layer which is then exposed; removing the exposed etch arresting layer in the Schottky diode region; etching the insulating layer away in a cathode area of the p-i-n diode region; and subsequently patterning the electrical contacts on the diode regions.

The invention is explained in greater detail below by way of embodiments shown in the accompanying drawings.

DETAILED DESCRIPTION OF THE PREFERRED EMBODIMENTS

Figure 1:
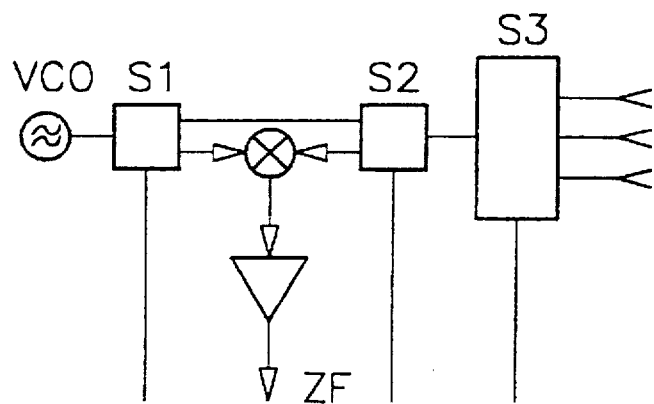
FIG. 1 is a circuit schematic of a known radar module front end in which the present invention may be utilized.
Figure 2:
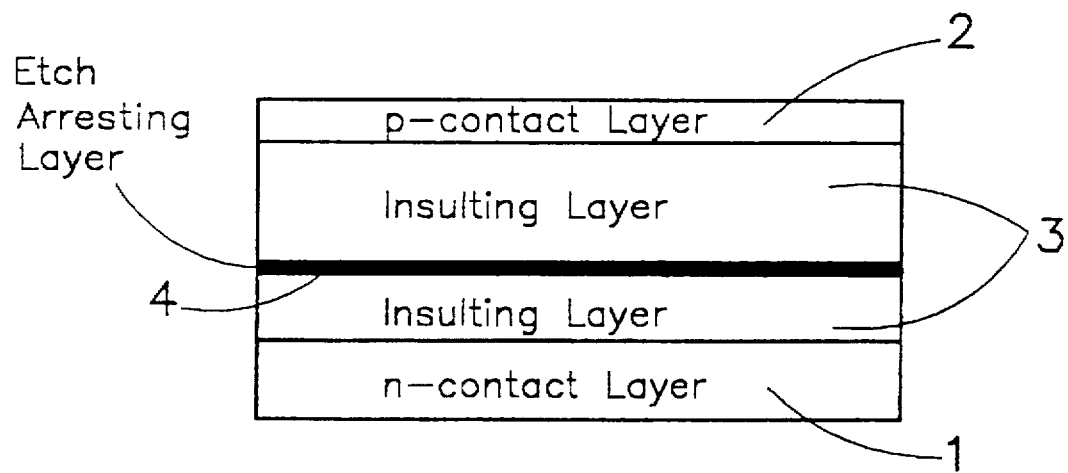
FIG. 2 illustrates the layer sequence from which p-i-n and Schottky diodes are made according to the invention.
Figure 3:
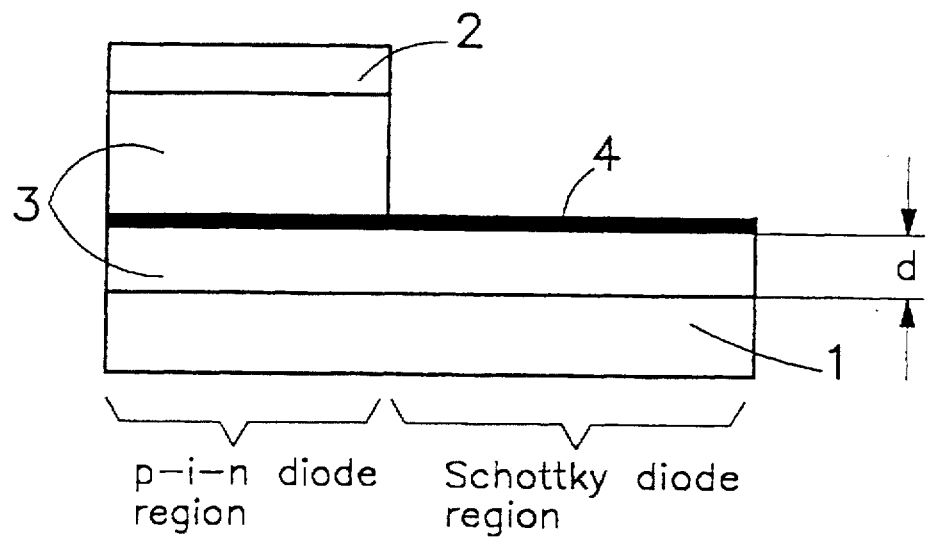
FIGS. 3 and 4 illustrate the arrangement and contact patterning of a p-i-n and Schottky diode.
Figure 4:
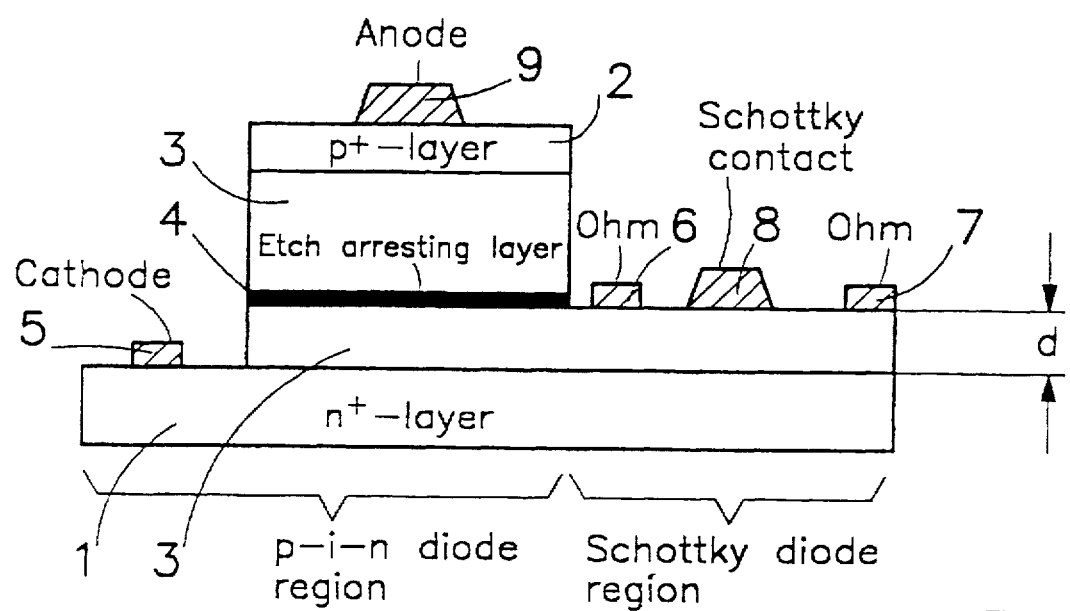

Referring to FIG. 2, there is shown a semiconductor layer sequence comprising an n-contact layer 1, a p-contact layer 2, and an insulating layer 3 arranged between the n- and p-contact layers 1 and 2, respectively. Insulating layer 3 comprises an etch arresting layer 4 arranged at a distance d from n-contact layer 1 as shown in FIGS. 3 and 4. Distance d of etch arresting layer 4 from n-contact layer 1 must be selected as a function of the doping concentration of insulating layer 3 such that small series resistances and barrier layer capacitances are obtained for the Schottky diode.

In an exemplary embodiment, an n-contact layer 1 is made of InGaAs, an insulating layer 3 is made of InGaAs, within the insulating layer 3 an etch arresting layer 4 is made of InAlAs, and p-contact layer 2 is made of InGaAs. These layers are grown in sequence on an InP substrate. Another option is to fabricate the substrate and the layers 1, 3, 2 from GaAs and layer 4 from GaInP. The n-contact layer 1 has a layer thickness, for example, of less than 1 μm and a doping concentration $N_D$ of more than $10^{18}$ cm$^{-3}$. The p-contact layer 2 has a thickness of approximately 100 nm and has a doping concentration $N_A$ of more than $10^{19}$ cm$^{-3}$. Insulating layer 3 has a layer thickness of less than 2 μm and a doping concentration $N_D$ which is smaller than $10^{17}$ cm$^{-3}$. Etch arresting layer 4 has a layer thickness of 2 to 5 nm and is arranged at a distance d of less than 100 nm from n-contact layer 1.

Referring more particularly to FIGS. 3 and 4, for the fabrication of Schottky and p-i-n diodes, semiconductor layers 2, 3 are removed in the region of the Schottky diode by wet-chemical or dry-chemical etching processes such that the etch agent stops at etch arresting layer 4 as shown in FIG. 3. Subsequently, a selective etching process is used which removes the exposed etch arresting layer 4 and stops at the surface of insulating layer 3. Insulating layer 3 is partially removed in the region of the p-i-n diode so that n-contact layer 1 is exposed in the region of the cathode 5. Subsequently, ohmic contact regions for the p-i-n and Schottky diodes are defined and produced, for example, by means of photolithography methods. A Schottky contact region 8 is defined, for example, by means of stepper or electron beam lithography methods and the metal contacts 5, 6, 7, 9 are realized in an evaporation process (FIG. 4).

The invention is not limited to the embodiments that are indicated. Rather, several p-i-n and Schottky diodes can be integrated monolithically depending on the mixer and switch functions that have to be realized in the circuit. Furthermore, it is possible to use other III/V semiconductor compounds for fabricating the semiconductor layer sequence.

The invention has been described in detail with respect to preferred embodiments, and it will now be apparent from the foregoing to those skilled in the art that changes and modifications may be made without departing from the invention in its broader aspects, and the invention, therefore, as defined in the appended claims is intended to cover all such changes and modifications as fall within the true spirit of the invention.

What is claimed is:

1. A monolithically integrated circuit for carrying out different mixer and switch functions, comprising:

at least one switch element comprising a p-i-n diode and at least one mixer element comprising a Schottky diode monolithically integrated in the circuit, wherein the p-i-n diode and Schottky diode are made from a common semiconductor layer sequence, the semiconductor layer sequence respectively includes: highly doped p-contact and n-contact layers, and a lightly doped insulating layer grown between the contact layers and which includes an etch arresting layer at a defined distance d from one of the contact layers, and wherein the p-contact layer and the insulating layer are comprised of InGaAs, the n-contact layer is comprised of InGaAs and the integrated circuit further comprises an InP substrate on which the layers are applied.

2. The monolithically integrated circuit according to claim 1, wherein the etch arresting layer is at a defined distance d from the n-contact layer.

3. A monolithically integrated circuit according to claim 1, wherein the p-i-n and Schottky diodes are arranged in a mesa construction.

4. A monolithically integrated circuit according to claim 1, wherein the n-contact layer has a layer thickness of less than 1 µm and a doping concentration $N_D$ exceeding $10^{18}$ $cm^{-3}$, the p-contact layer has a layer thickness of approximately 100 nm and a doping concentration $N_A$ exceeding $10^{19}$ $cm^{-3}$, and the insulating layer has a layer thickness of less than 2 µm and a doping concentration $N_D$ which is smaller than $10^{17}$ $cm^{-3}$.

5. A monolithically integrated circuit for carrying out different mixer and switch functions, comprising:

at least one switch element comprising a p-i-n diode and at least one mixer element comprising a Schottky diode monolithically integrated in the circuit, wherein the p-i-n diode and Schottky diode are made from a common semiconductor layer sequence, the semiconductor layer sequence respectively includes: highly doped p-contact and n-contact layers, and a lightly doped insulating layer grown between the contact layers and which includes an etch arresting layer at a defined distance d from one of the contact layers, and wherein the contact layers and the insulating layer are comprised of GaAs; and the integrated circuit further comprises a GaAs substrate on which the semiconductor layer sequence is applied and the n-contact layer has a layer thickness of less than 1 µm and a doping concentration $N_D$ exceeding $10^{18}$ $cm^{-3}$, the p-contact layer has a layer thickness of approximately 100 nm and a doping concentration $N_A$ exceeding $10^{19}$ $cm^{-3}$, and the insulating layer has a layer thickness of less than 2 µm and a doping concentration $N_D$ which is smaller than $10^{17}$ $cm^{-3}$.

6. A monolithically integrated circuit for carrying out different mixer and switch functions, comprising:

at least one switch element comprising a p-i-n diode and at least one mixer element comprising a Schottky diode monolithically integrated in the circuit, wherein the i-i-n diode and Schottky diode are made from a common semiconductor layer sequence, the semiconductor layer sequence respectively includes: highly doped p-contact and n-contact layers, and a lightly doped insulating layer grown between the contact layers and which includes an etch arresting layer at a defined distance d from one of the contact layers, and wherein the etch arresting layer is located in the insulating layer at a distance d of less than 100 nm from the n-contact layer, and the layer thickness of the etch arresting layer is in a range from 2 to 5 nm.

* * * * *